United States Patent
Jung

(10) Patent No.: US 7,214,586 B2
(45) Date of Patent: May 8, 2007

(54) METHODS OF FABRICATING NONVOLATILE MEMORY DEVICE

(75) Inventor: Jin Hyo Jung, Bucheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 70 days.

(21) Appl. No.: 11/024,746

(22) Filed: Dec. 30, 2004

(65) Prior Publication Data

US 2005/0142750 A1    Jun. 30, 2005

(30) Foreign Application Priority Data

Dec. 31, 2003    (KR) .................. 10-2003-0101070

(51) Int. Cl.
*H01L 21/336*    (2006.01)

(52) U.S. Cl. .............. 438/257; 438/423; 438/238; 438/381; 257/E21; 257/662; 257/679

(58) Field of Classification Search ............... 438/257, 438/238, 381, 263, 264, 423, 439, 445, 424, 438/692, 689, 954
See application file for complete search history.

(56) References Cited

U.S. PATENT DOCUMENTS

| | | | | |
|---|---|---|---|---|
| 5,149,669 A | * | 9/1992 | Hosaka | 438/444 |
| 5,612,249 A | * | 3/1997 | Sun et al. | 438/297 |
| 5,661,057 A | * | 8/1997 | Fujiwara | 438/257 |
| 5,766,992 A | * | 6/1998 | Chou et al. | 438/241 |
| 6,197,639 B1 | * | 3/2001 | Lee et al. | 438/258 |
| 6,573,557 B1 | | 6/2003 | Watanabe | |
| 6,635,532 B2 | | 10/2003 | Song et al. | |
| 7,125,771 B2 | * | 10/2006 | Jung | 438/261 |

FOREIGN PATENT DOCUMENTS

KR    1020010037863    5/2001

* cited by examiner

*Primary Examiner*—David Nhu
(74) *Attorney, Agent, or Firm*—Lowe Hauptman & Berner LLP

(57) ABSTRACT

A method of fabricating nonvolatile memory devices. The method includes forming a tunnel oxide layer, a stacked oxide layer, a polysilicon layer for a control gate, a buffer oxide layer and a buffer nitride layer in order on the entire surface of a semiconductor substrate, and patterning the substrate vertically to form a control gate and a first device isolation region. The method also includes implanting ions into the first device isolation region to form common source and drain regions, filling the gap of the first device isolation region to form a first device isolation structure, and removing the buffer nitride layer and the buffer oxide layer. The method further includes depositing polysilicon for a word line on the substrate, and patterning the substrate vertically to form the word line and a second device isolation region, forming sidewall spacers on the sidewalls of the control gate and the word line, and forming silicide on the word line.

14 Claims, 10 Drawing Sheets

METHODS OF FABRICATING NONVOLATILE MEMORY DEVICE

BACKGROUND OF THE INVENTION

1. Field of the Invention

The present invention relates to a method of fabricating nonvolatile memory devices and, more particularly, to a method of fabricating nonvolatile memory devices which embody a NOR flash cell with a stacked oxide layer with $4F^2$ unit cell area.

2. Background of the Related Art

In general, there are two categories in semiconductor devices, namely, volatile memory and non-volatile memory. Volatile memory includes dynamic random access memory (hereinafter referred to as "DRAM") and static DRAM (hereinafter referred to as "SDRAM"). One characteristic of volatile memory is that data is maintained only while electric power is applied. In other words, when power is turned off, the data in the volatile memory disappears. On the other hand, non-volatile memory, mainly ROM (Read Only Memory), can maintain data regardless of the application of electric power.

From the point of a view of a fabrication process, non-volatile memory is divided into a floating gate type and a metal insulator semiconductor (hereinafter referred to as "MIS") type. The MIS type has doubly or triply deposited dielectric layers which comprise at least two kinds of dielectric materials.

The floating gate type stores data using potential wells, and is represented by an ETOX (Electrically erasable programmable read only memory Tunnel OXide) used in a flash EEPROM (Electrically Erasable Programmable Read Only Memory).

The MIS type performs program operation using traps at a bulk dielectric layer, an interface between dielectric layers, and an interface between a dielectric layer and a semiconductor. Metal/Silicon ONO Semiconductor (hereinafter referred to as "MONOS/SONOS") structure mainly used for the flash EEPROM is a representative MIS structure.

Referring to FIG. 1, a device isolation structure 11 is formed on a semiconductor substrate 10, on which a gate oxide layer 12 is formed. A first polysilicon layer 13 formed on the gate oxide layer 12 is then used as a floating gate. A dielectric layer 15 and a second polysilicon layer 16 are sequentially formed on the floating gate 13, and the second polysilicon layer 16 is used as a control gate. A flash memory cell is then completed by depositing a metal layer 17 and a nitride layer 18 on the control gate 16, and by patterning them in cell structure.

For the present fabricating processes of NOR flash memories, a self-aligned source (hereinafter referred to as "SAS") process or a self-aligned shallow trench isolation (hereinafter referred to as "SA-STI") process is chiefly adopted to minimize the unit cell area of the NOR flash memories. Although the SAS or the SA-STI processes or even both processes are applied, the unit cell area can not be reduced down to the minimum area($4F^2$) of a NAND flash cell, because a bit contact must be formed.

SUMMARY OF THE INVENTION

Accordingly, the present invention is directed to a method of fabricating nonvolatile memory devices that substantially obviates one or more problems due to limitations and disadvantages of the related art.

The present invention advantageously provides a method of fabricating nonvolatile memory devices which embodies a flash memory with $4F^2$ unit cell area without the need for adopting an SAS process or an SA-STI process and has simpler manufacturing processes than those for a NOR flash cell using floating gate devices according to the related art.

To achieve these objects and other advantages and in accordance with the purpose of the invention, as embodied and broadly described herein, a method of fabricating nonvolatile memories includes forming a tunnel oxide layer, a stacked oxide layer, a polysilicon layer for a control gate, a buffer oxide layer and a buffer nitride layer in order on the entire surface of a semiconductor substrate, patterning the substrate vertically to form a control gate and a first device isolation region, implanting ions into the first device isolation region to form common source and drain regions, filling the gap of the first device isolation region to form a first device isolation structure, removing the buffer nitride layer and the buffer oxide layer, depositing polysilicon for a word line on the substrate, and patterning the substrate vertically to form the word line and a second device isolation region, forming sidewall spacers on the sidewalls of the control gate and the word line, and forming silicide on the word line.

It is to be understood that both the foregoing general description and the following detailed description of the present invention are exemplary, but are not restrictive of the invention.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to exemplary embodiments of the present invention which are illustrated in the accompanying drawings.

Figure 1:
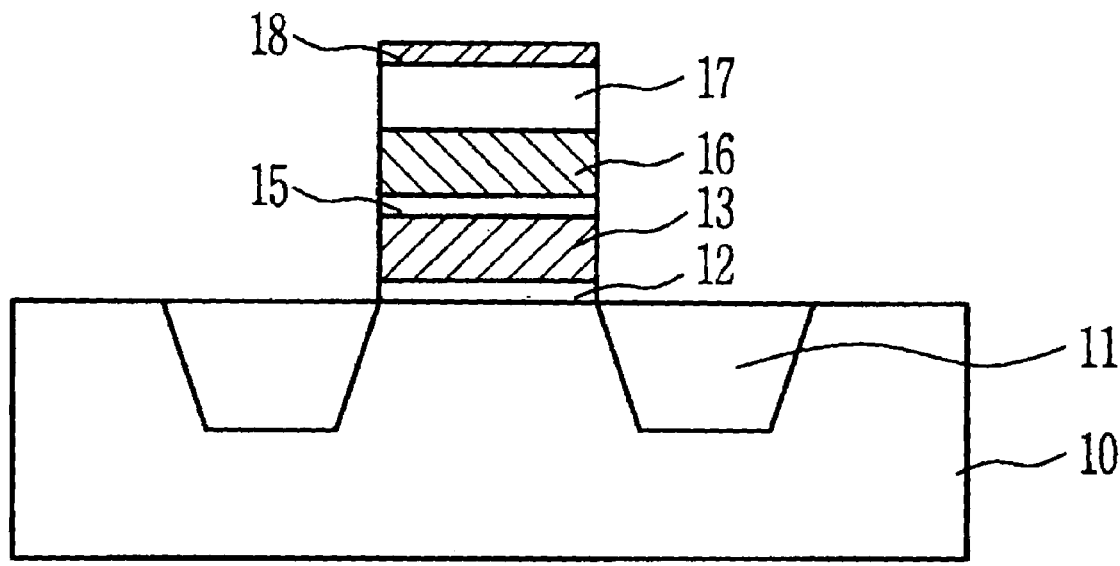
FIG. 1 is a cross-sectional view illustrating a flash memory cell fabricated in accordance with the related art.
Figure 2:
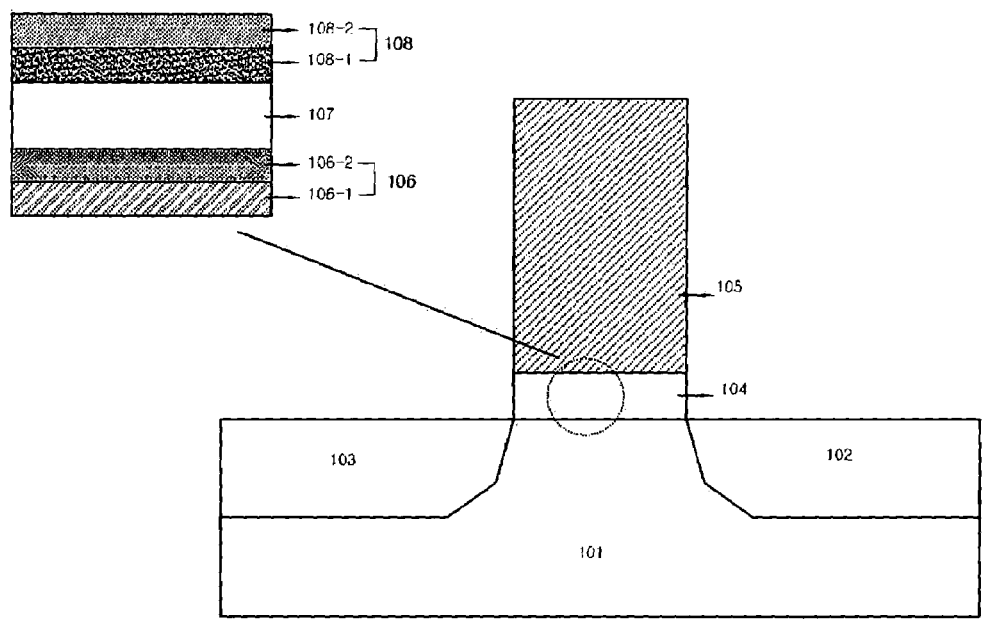
FIG. 2 is a cross-sectional view illustrating a nonvolatile memory device in accordance with the present invention.

Referring to FIG. 2, a nonvolatile memory device in accordance with the present invention is illustrated. A stacked oxide layer 104 and a polysilicon gate 105 are sequentially formed on a P-type substrate. A source 103 and a drain 102 are formed under respective sides of the gate 105. The stacked oxide layer 104 comprises a tunnel oxide layer 106, a storage oxide layer 107 and a block oxide layer 108. The tunnel oxide layer 106 comprises a single layer or a multi-layer of a first tunnel oxide layer 106-1 and a second tunnel oxide layer 106-2. Similarly, the block oxide layer 108 comprises a single layer or a multi-layer of a first block oxide layer 108-1 and a second block oxide layer 108-2.

If the tunnel oxide layer has a single layer, it may be made of one of $SiO_2$, $Al_2O_3$ and $Y_2O_3$. If the tunnel oxide layer has a multi-layer, the first tunnel oxide layer may be made of one of $Al_2O_3$, $Y_2O_3$, $HfO_2$, $ZrO_2$, $BaZrO_2$, $BaTiO_3$, $Ta_2O_5$, CaO, SrO, BaO, $La_2O_3$, $Ce_2O_3$, $Pr_2O_3$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$ and $Lu_2O_3$, and the second tunnel oxide layer may be made of one of $SiO_2$, $Al_2O_3$ and $Y_2O_3$.

The storage oxide layer may be made of one of $HfO_2$, $ZrO_2$, $BaZrO_2$, $BaTiO_3$, $Ta_2O_5$, CaO, SrO, BaO, $La_2O_3$, $Ce_2O_3$, $Pr_2O_3$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$ and $Lu_2O_3$.

If the block oxide layer has a single layer, it may be made of one of $SiO_2$, $Al_2O_3$ and $Y_2O_3$. If the block oxide layer has a multi-layer, the first block oxide layer may be made of one of $SiO_2$, $Al_2O_3$ and $Y_2O_3$, and the second block oxide layer may be made of one of $Al_2O_3$, $Y_2O_3$, $HfO_2$, $ZrO_2$, $BaZrO_2$, $BaTiO_3$, $Ta_2O_5$, CaO, SrO, BaO, $La_2O_3$, $Ce_2O_3$, $Pr_2O_3$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Tm_2O_3$, $Yb_2O_3$ and $Lu_2O_3$.

For the program operation of the device, hot electron injection is carried out. When hot electrons are implanted into the potential well formed in the storage oxide layer, they jump the energy barrier of the tunnel oxide layer and a threshold voltage is increased. For the erase operation of the device, the electrons, which are stored in the potential well of the storage oxide layer, move to the silicon substrate by FN (Fowler-Nordheim) tunneling. Thus, the threshold voltage is decreased. For the read operation of the device, a middle voltage between the threshold voltage of the program state and that of the erase state is applied to the gate. A device state of either the program or the erase is determined by detecting current due to the applied voltage.

Figure 3A:
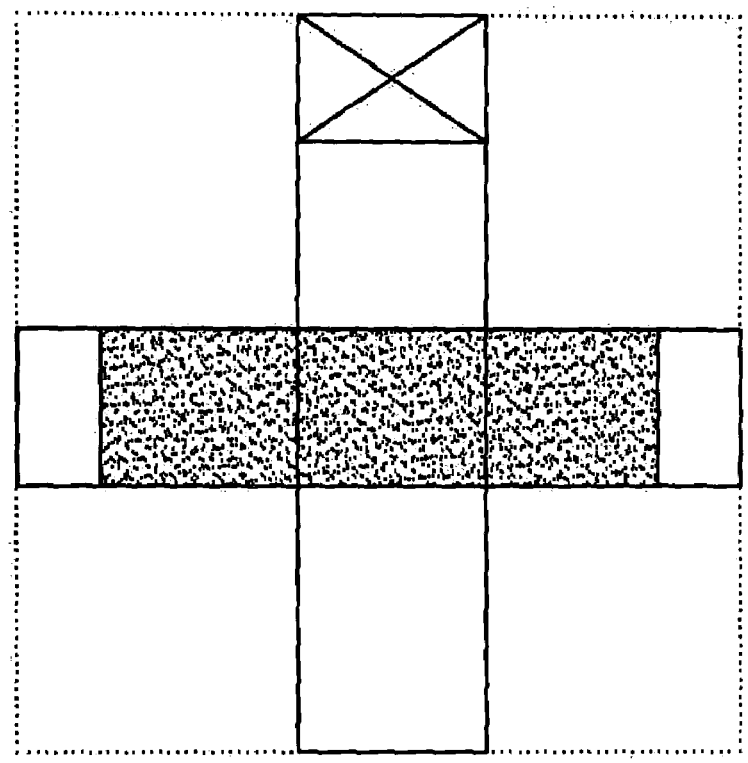
FIGS. 3a to 3d are a drawings comparing unit cell areas of a NOR flash memory according to the related art and a nonvolatile memory device according to the present invention.

Referring to FIG. 3a, a NOR flash unit cell area with a bit contact is about $10.5F^2$ when both an SAS and an SA-STI process are not applied.

Figure 3B:
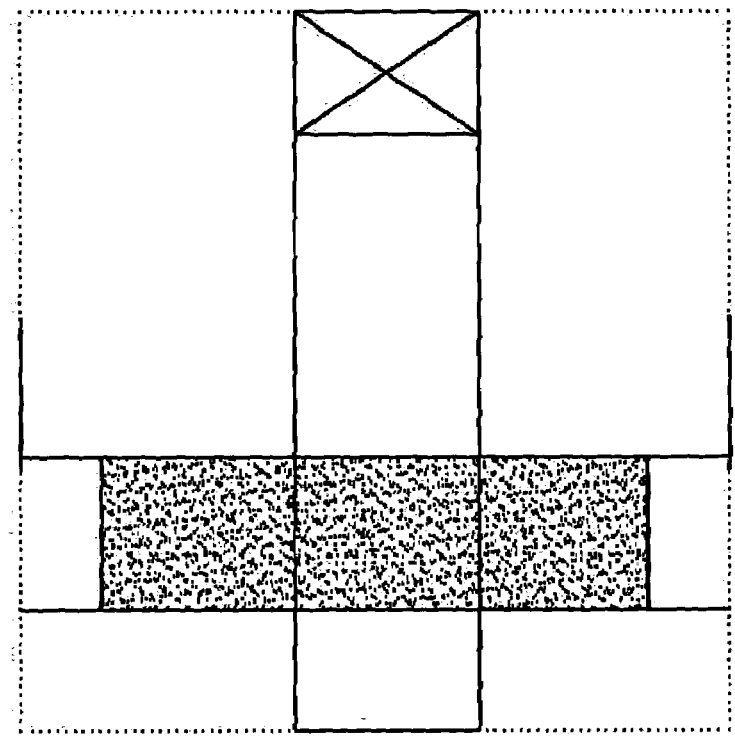

Referring to FIG. 3b, a NOR flash unit cell area with a bit contact is about $9F^2$ when only the SAS process is applied. Thus, the cell area can be reduced by about 15% in comparison to the cell area of the cell in FIG. 3a, due to the SAS process.

Figure 3C:
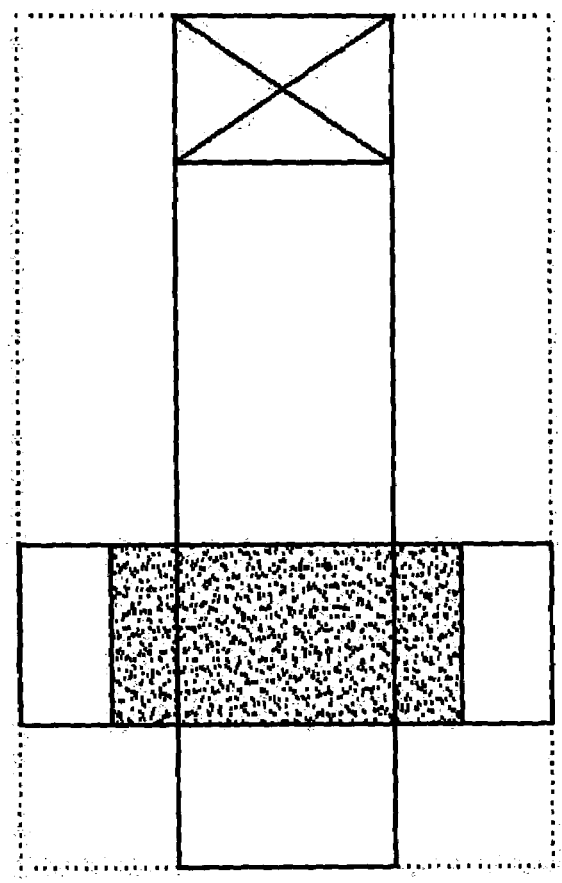

Referring to FIG. 3c, a NOR flash unit cell area with a bit contact is about $6F^2$ when both the SAS and the SA-STI process are applied. Thus, the cell area can be reduced by about 43% and 33% in comparison to the cell area in FIG. 3a and FIG. 3b, respectively.

Figure 3D:
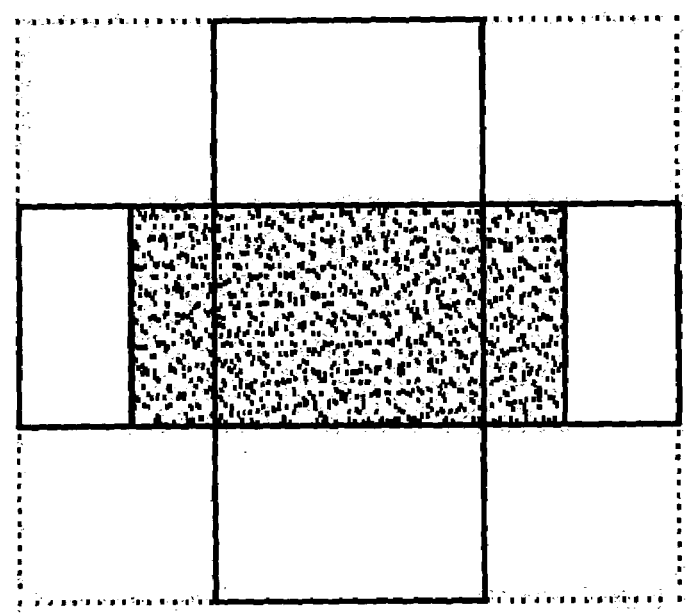

Referring to FIG. 3d, a NOR flash unit cell with a stacked oxide layer, which doesn't have a bit contact, has a unit cell area of about $4F^2$ in accordance with the present invention.

The $4F^2$ corresponds to a NAND flash unit cell area using the SA-STI process. Thus, the cell area can be reduced by about 62%, 55%, and 33% as compared to the cell area in FIG. 3a, FIG. 3b, and FIG. 3c, respectively.

Figure 4A:
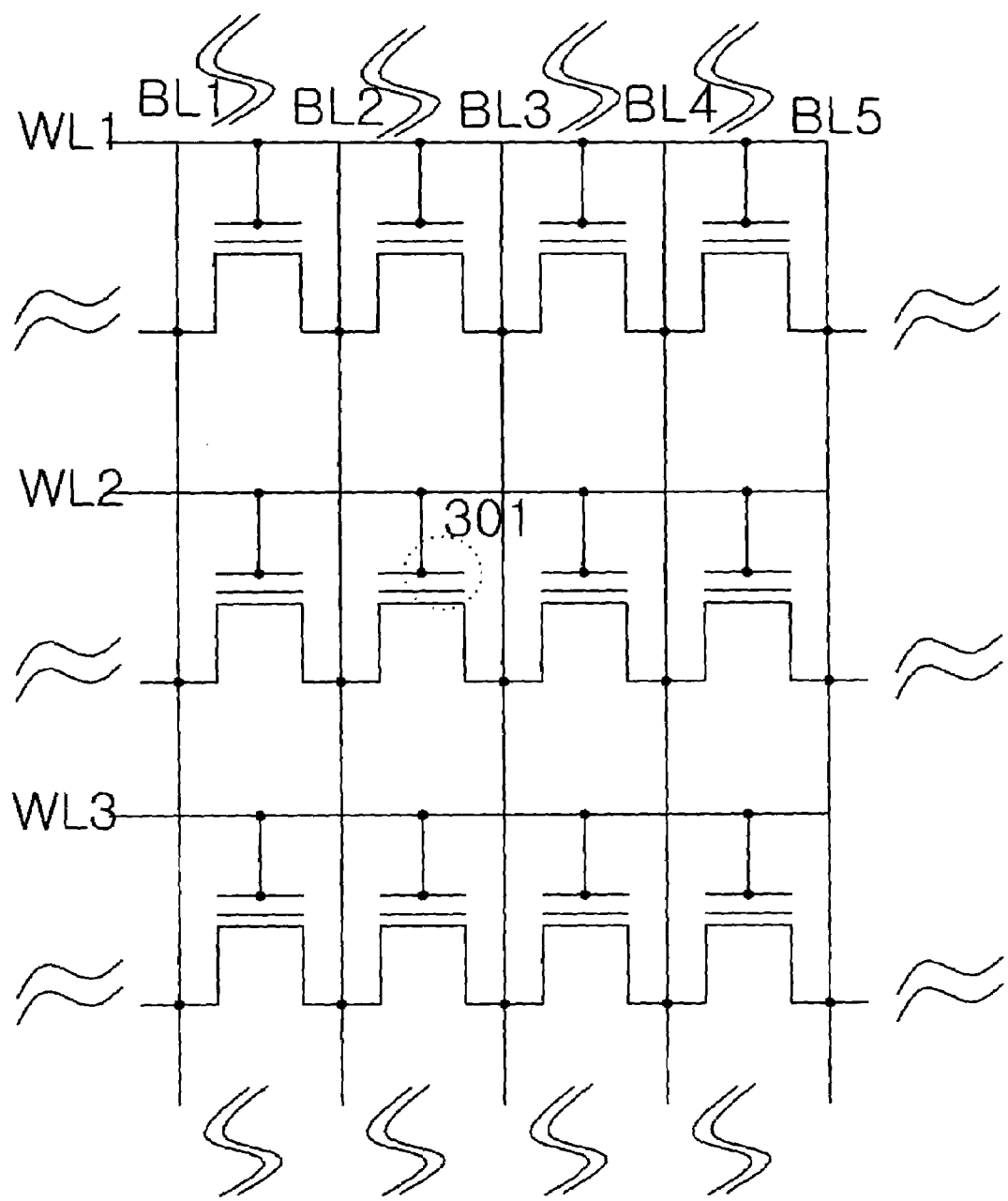
FIGS. 4a and 4b are top views illustrating a cell array layout and a cell array circuit of a nonvolatile memory device according to the present invention respectively.
Figure 4B:
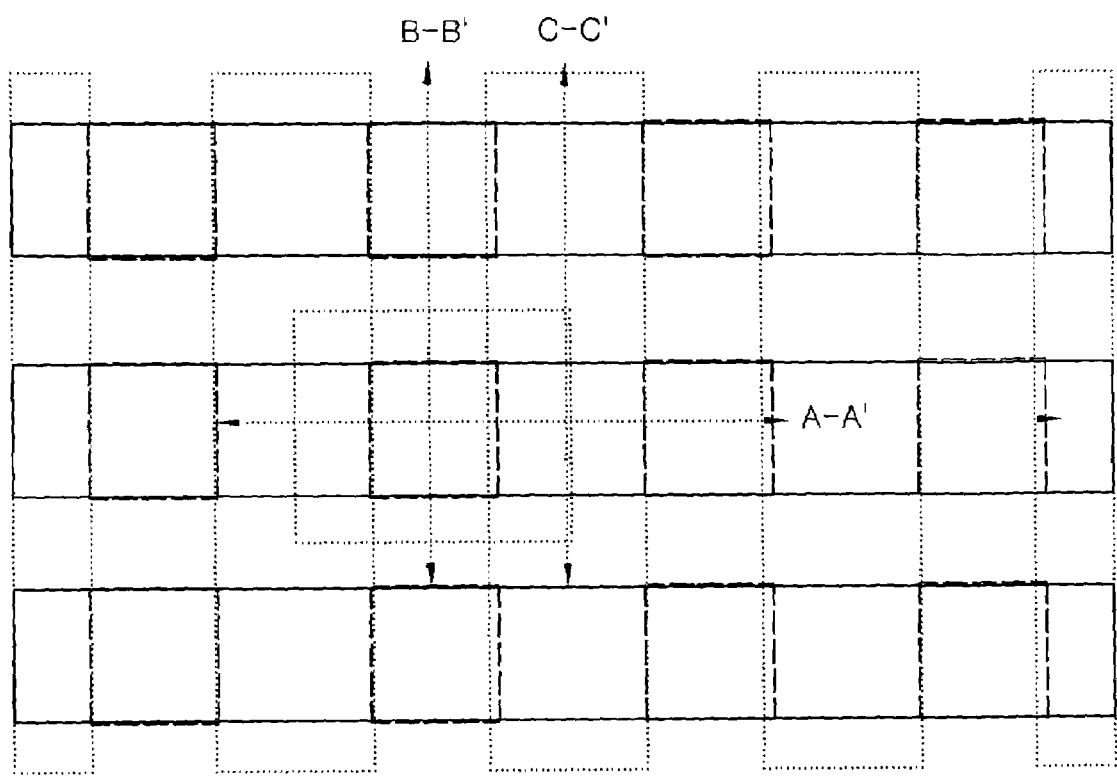

Referring to FIG. 4a and 4b, top views of a cell array layout and a cell array circuit of a nonvolatile memory according to the present invention are illustrated. A floating gate device 301 is shown in FIG. 4a. Cross-sectional views along the line A–A' of FIG. 4b are shown in FIGS. 5a, 6a, 7a, 8a, and 9a. Cross-sectional views along the line B–B' of FIG. 4b are shown in FIGS. 5b, 6b, 7b, 8b, and 9b. Cross-sectional views along the line C–C' of FIG. 4b are shown in FIGS. 5c, 6c, 7c, 8c, and 9c.

Figure 5A:
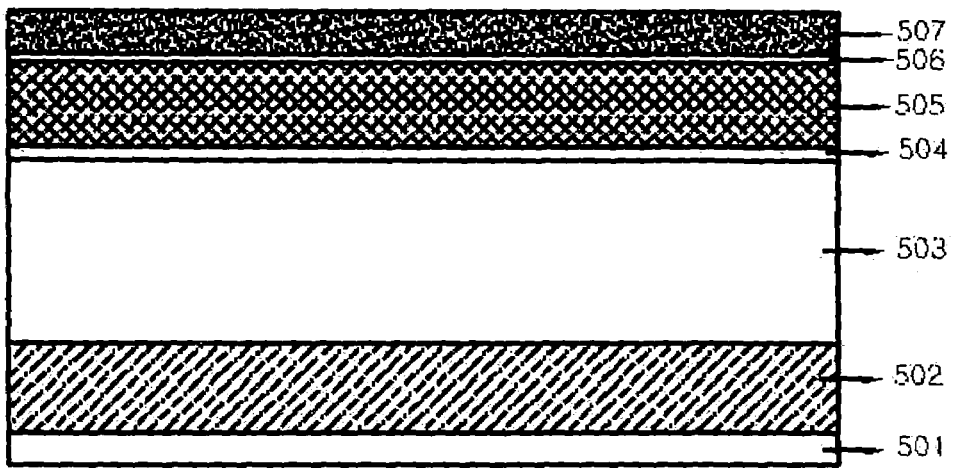
FIGS. 5a through 5c are cross-sectional views illustrating example processes of fabricating nonvolatile memory devices according to an embodiment of the present invention.
Figure 5B:
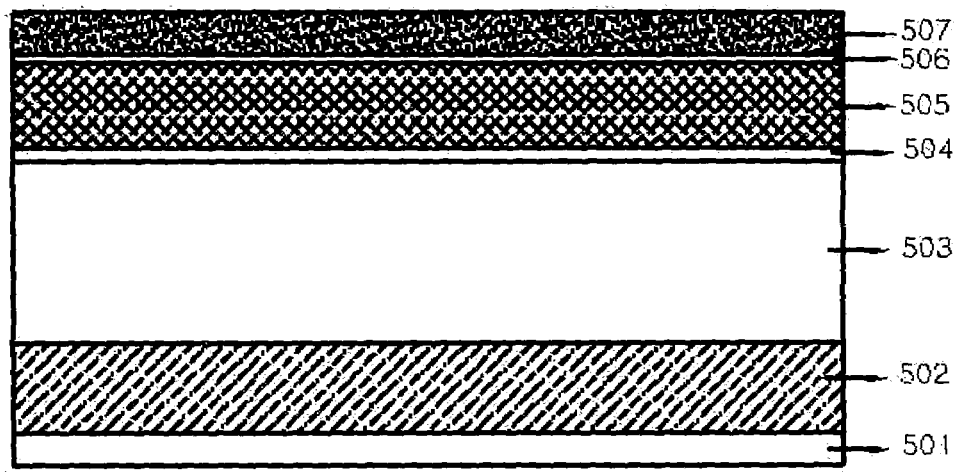
Figure 5C:
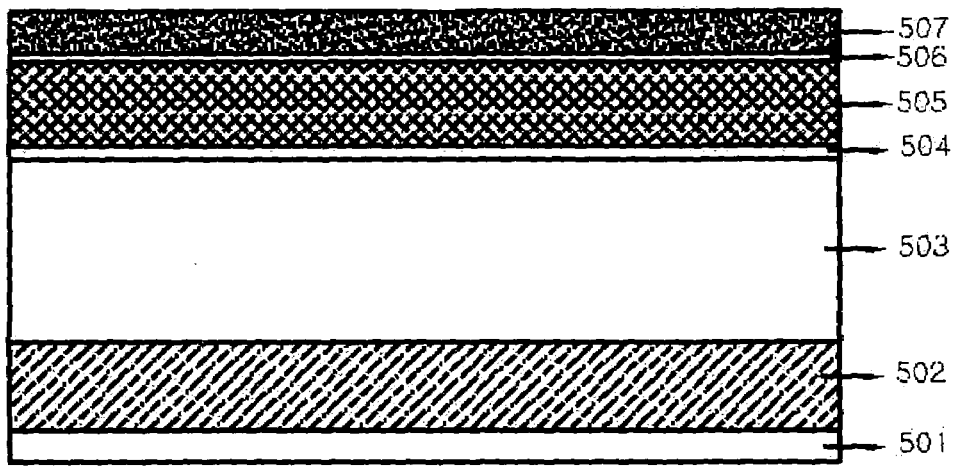

Referring to FIGS. 5a, 5b, and 5c, a deep N-type well 502 and a P-type well 503 are each defined in a semiconductor substrate 501 by using ion implantation processes. When the P-type well is defined, ion implantations for adjusting a threshold voltage and/or preventing a punch-through may be simultaneously performed. As a tunnel oxide layer, a storage oxide layer and a block oxide layer are sequentially formed, a stacked oxide layer 504 is completed. Thereafter, a polysilicon layer 505 for a control gate, a buffer oxide layer 506 and a buffer nitride layer 507 are sequentially deposited on the stacked oxide layer 504.

If the tunnel oxide layer has a single layer, it may be made of one of $SiO_2$, $Al_2O_3$ and $Y_2O_3$ with a thickness between about 30 Å and about 150 Å. If the tunnel oxide layer has a multi-layer, the first tunnel oxide layer may be made of one of $Al_2O_3$, $Y_2O_3$, $HfO_2$, $ZrO_2$, $BaZrO_2$, $BaTiO_3$, $Ta_2O_5$, CaO, SrO, BaO, $La_2O_3$, $Ce_2O_3$, $Pr_2O_3$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$ with a thickness between about 30 Å and about 150 Å, and the second tunnel oxide layer may be made of one of $SiO_2$, $Al_2O_3$ and $Y_2O_3$ with a thickness between about 5 Å and about 50 Å.

The storage oxide layer may be made of one of $HfO_2$, $ZrO_2$, $BaZrO_2$, $BaTiO_3$, $Ta_2O_5$, CaO, SrO, BaO, $La_2O_3$, $Ce_2O_3$, $Pr_2O_3$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$ and $Lu_2O_3$ with a thickness between about 40 Å and about 500 Å.

If the block oxide layer has a single layer, it may be made of one of $SiO_2$, $Al_2O_3$ and $Y_2O_3$ with a thickness between about 40 Å and about 200 Å. If the block oxide layer has a multi-layer, the first block oxide layer may be made of one of $SiO_2$, $Al_2O_3$ and $Y_2O_3$ with a thickness between about 5 Å and about 50 Å, and the second block oxide layer may be made of one of $Al_2O_3$, $Y_2O_3$, $HfO_2$, $ZrO_2$, $BaZrO_2$, $BaTiO_3$, $Ta_2O_5$, CaO, SrO, BaO, $La_2O_3$, $Ce_2O_3$, $Pr_2O_3$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$ and $Lu_2O_3$ with a thickness between about 40 Å and about 200 Å.

Here, as doped polysilicon may be used for the polysilicon layer 505, or after an undoped polysilicon layer is deposited on the substrate, the undoped polysilicon layer may be doped through an ion implantation process. In an exemplary embodiment, the polysilicon layer 505 for a control gate is deposited with a thickness between about 500 Å and about 3000 Å. The buffer oxide layer is deposited with a thickness between about 100 Å and about 200 Å. The buffer nitride layer is deposited with a thickness between about 100 Å and about 2000 Å.

Figure 6A:
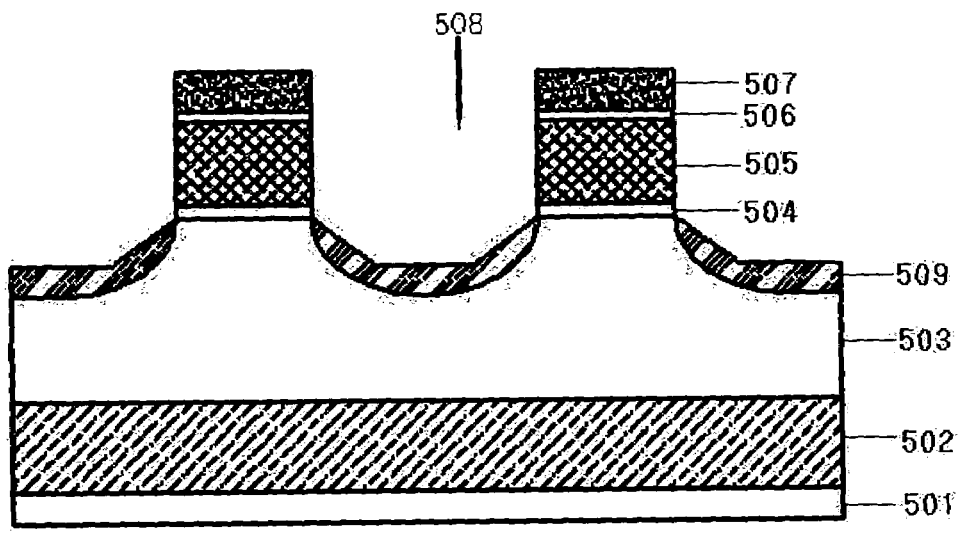
FIGS. 6a through 6c are cross-sectional views illustrating example processes of fabricating nonvolatile memory devices according to an embodiment of the present invention.
Figure 6B:
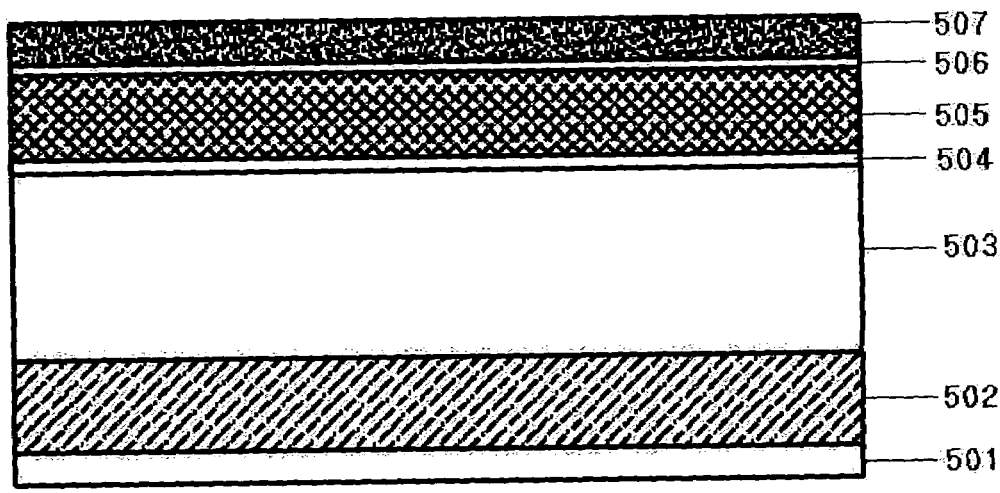
Figure 6C:
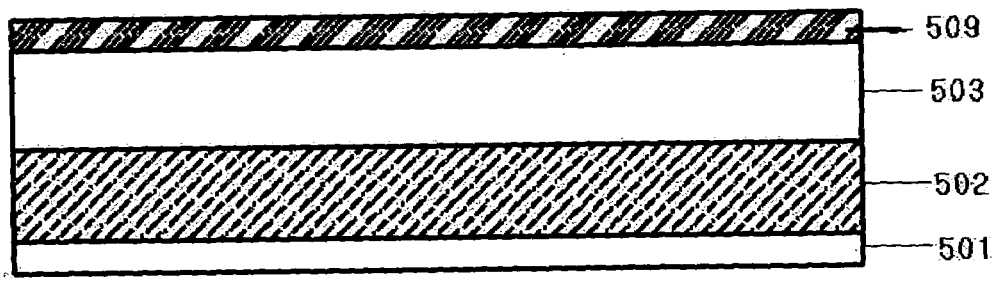

Referring to FIGS. 6a, 6b, and 6c, the substrate is etched along the line B-B' through a photolithography process, so that a device isolation structure 508 is formed. Predetermined ions or dopants are implanted to form common source and drain regions 509 in the region where the device isolation structure is formed. Before this implantation process for the common source and drain regions, an oxide growth process may be carried out for the sidewalls of the control gate and the device isolation structure.

Figure 7A:
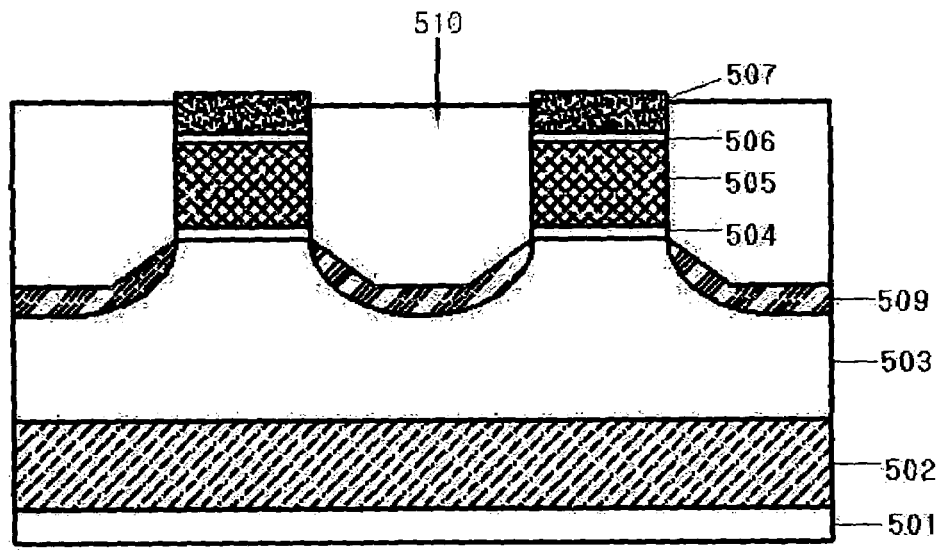
FIGS. 7a through 7c are cross-sectional views illustrating example processes of fabricating nonvolatile memory devices according to an embodiment of the present invention.
Figure 7B:
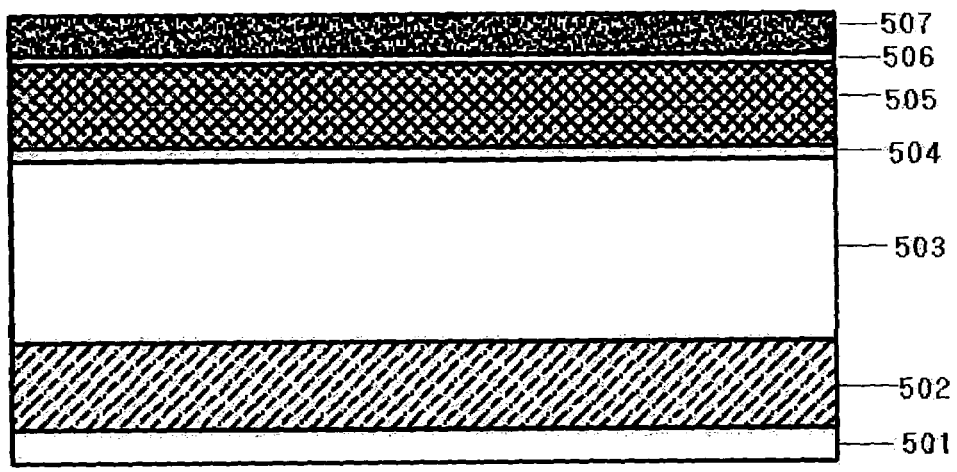
Figure 7C:
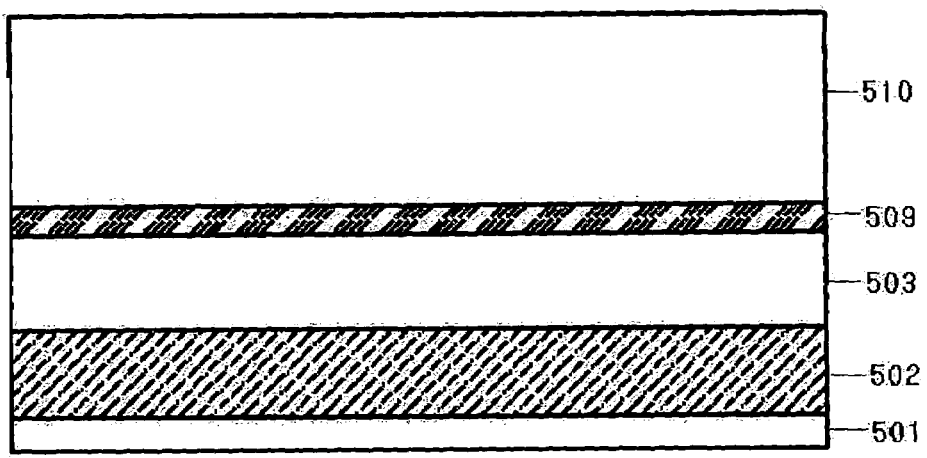

Referring to FIGS. 7a, 7b, and 7c, an APCVD (Atmospheric Pressure Chemical Vapor Deposition) or an HDP-CVD (High Density Plasma Chemical Vapor Deposition) process is applied to fill the gap between the device isolation structure and the control gate with an oxide layer 510. An etchback process is performed to smooth the oxide layer 510, until the oxide layer 510 is recessed to the middle of the buffer nitride layer 507. A CMP (Chemical Mechanical Polishing) process may be carried out instead of the etchback process for the smoothing of the oxide layer 510.

Figure 8A:
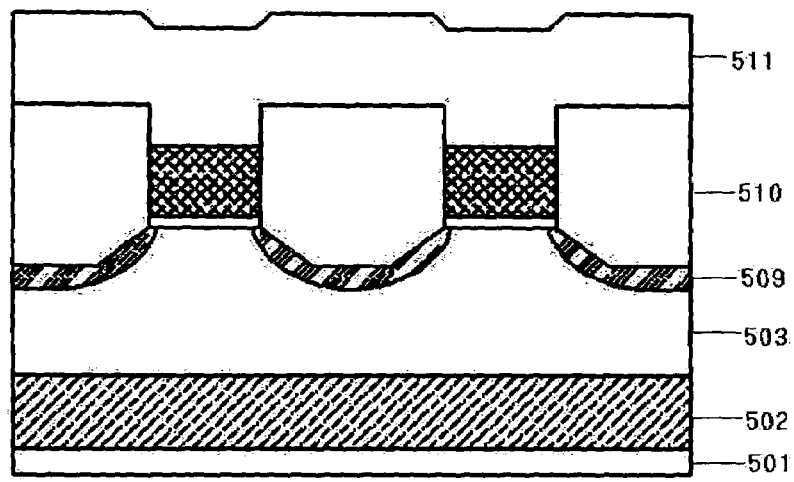
FIGS. 8a through 8c are cross-sectional views illustrating example processes of fabricating nonvolatile memory devices according to an embodiment of the present invention.
Figure 8B:
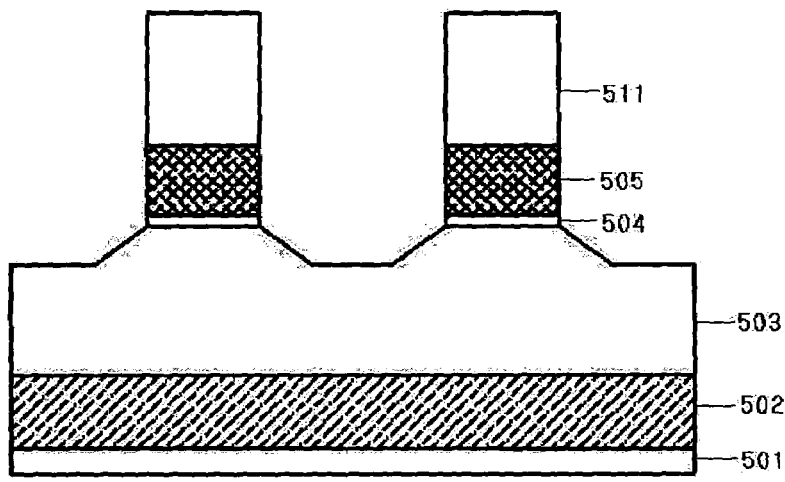
Figure 8C:
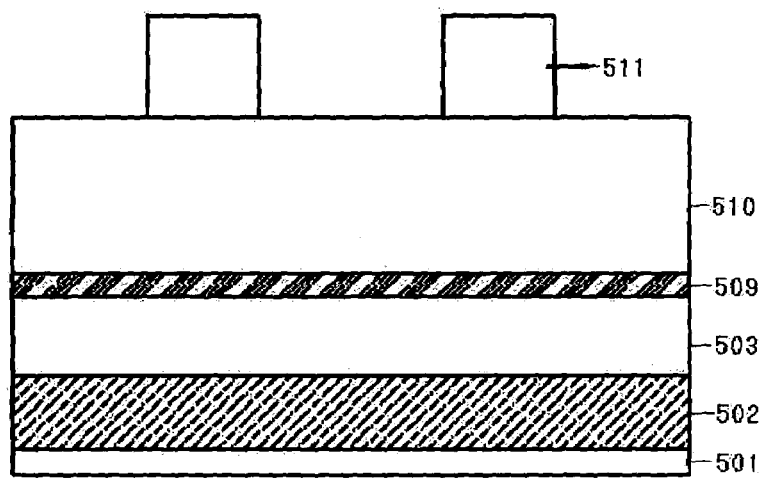

Referring to FIGS. 8a, 8b, and 8c, after the buffer nitride layer and the buffer oxide layer on the control gate are removed by a wet etch, polysilicon 511 is deposited on the entire surface of the substrate. After the substrate is patterned along the word line (the line A-A'), the substrate is etched to form a word line. At the same time, as the control gate and the stacked oxide layer are patterned along the word line, a device isolation structure is formed to isolate each word line. In order to prevent a leakage current caused by a punch-through between the common source and drain regions, the device isolation structure may be etched more deeply than the junction depth of the common source and drain regions. The word line connects all the control gates, and may be utilized as a mask for any additional ion implantation in the later processes. As doped polysilicon may be used for the word line or after an undoped polysilicon layer is deposited on the substrate, the undoped polysilicon layer may be doped through an ion implantation process. In one embodiment, the polysilicon layer for the word line is deposited with a thickness between about 500 Å and about 3000 Å. After the word line is completed, an oxide layer may be deposited on the surface and the sidewalls of the exposed word line, the sidewalls of the control gate and the surface of the exposed device isolation structure.

Figure 9A:
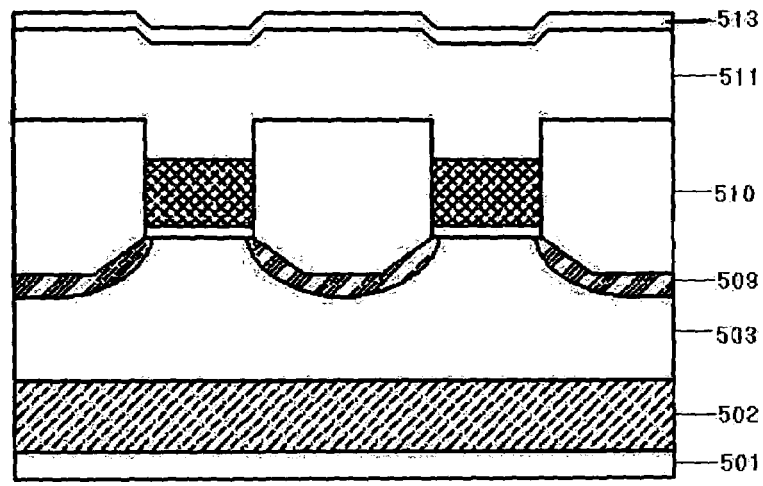
FIGS. 9a through 9c are cross-sectional views illustrating example processes of fabricating nonvolatile memory devices according to an embodiment of the present invention.
Figure 9B:
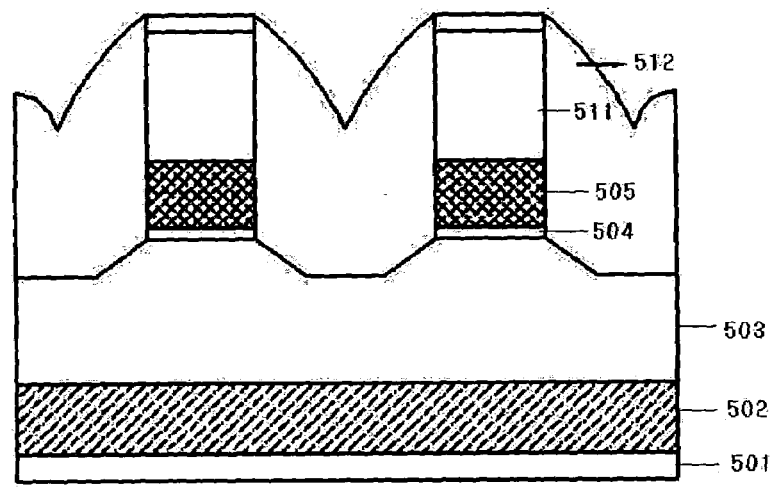
Figure 9C:
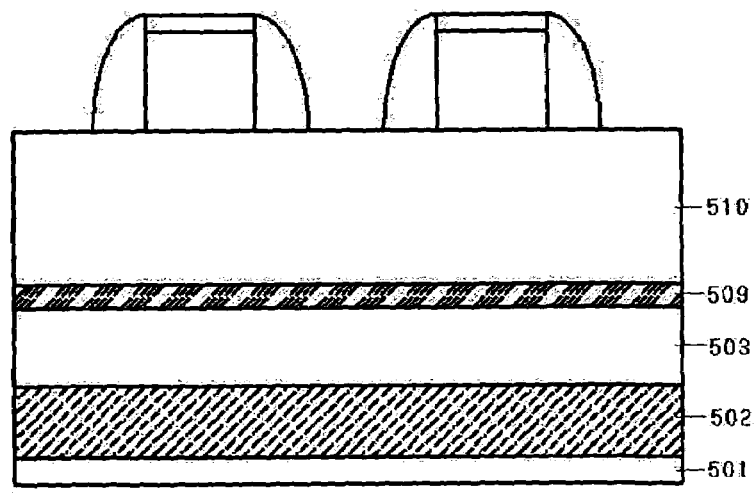

Referring to FIGS. 9a, 9b, and 9c, sidewall spacers 512 are formed on the sidewalls of the control gate and the word line, and a silicide layer 513 is then selectively formed only on the word line by means of a silicide process. Because the insulation layer, which is deposited to form the sidewall spacers on the entire surface of the substrate, also fills the gap between the device isolation structure and the control gate, oxide may be deposited on the substrate as the insulation layer for the sidewall spacers, although nitride may be used.

Accordingly, the disclosed methods form a control gate and a device isolation structure at the same time, and use the control gate as a mask to form common source and drain regions in the device isolation region without any additional mask for forming source and drain regions. Thus, although neither an SAS process nor an SA-STI process is applied, a NOR flash cell area is effectively reduced. As this method doesn't need a bit contact which connects each drain of nonvolatile memory device with a stacked oxide layer to a bit line, a NOR flash cell area can be reduced by the area a NAND flash cell occupies. In addition, because an oxide layer is used as a material for storing electric charges instead of a floating gate, whose formation process is omitted, production cost is reduced.

Korean Patent Application Serial Number 10-2003-0101070, filed on Dec. 31, 2003, is hereby incorporated by reference in its entirety.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of fabricating nonvolatile memories comprising the steps of:
    forming a tunnel oxide layer, a stacked oxide layer, a polysilicon layer for a control gate, a buffer oxide layer and a buffer nitride layer in order on a surface of a semiconductor substrate;
    patterning the semiconductor substrate vertically to form a control gate and a first device isolation region;
    implanting ions into the first device isolation region to form common source and drain regions;
    filling a gap of the first device isolation region to form a first device isolation structure;
    removing a portion of the buffer nitride layer and a portion of the buffer oxide layer;
    depositing polysilicon for a word line on the semiconductor substrate, and patterning the semiconductor substrate vertically to form the word line and a second device isolation region;
    forming sidewall spacers on sidewalls of the control gate and the word line; and
    forming silicide on the word line.

2. The method as defined by claim 1, wherein the step of forming a stacked oxide layer includes forming the stacked oxide layer comprising a tunnel oxide layer, a storage oxide layer and a block oxide layer.

3. The method as defined by claim 2, wherein the step of forming a tunnel oxide layer includes forming the tunnel oxide layer comprising a single layer or a multi-layer of a first tunnel oxide layer and a second tunnel oxide layer.

4. The method as defined by claim 3, wherein the step of forming a tunnel oxide layer includes forming a single layer of one of $SiO_2$, $Al_2O_3$ and $Y_2O_3$ with a thickness between about 30 Å and about 150 Å.

5. The method as defined by claim 3, wherein the step of forming a tunnel oxide layer includes forming the first tunnel oxide layer of one of $Al_2O_3$, $Y_2O_3$, $HfO_2$, $ZrO_2$, $BaZrO_2$, $BaTiO_3$, $Ta_2O_5$, $CaO$, $SrO$, $BaO$, $La_2O_3$, $Ce_2O_3$, $Pr_2O_3$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$ and $Lu_2O_3$ with a thickness between about 30 Å and about 150 Å, and forming the second tunnel oxide layer of one of $SiO_2$, $Al_2O_3$ and $Y_2O_3$ with a thickness between about 5 Å and about 50 Å.

6. The method as defined by claim 2, wherein the step of forming a stacked oxide layer includes forming the storage oxide layer of one of $HfO_2$, $ZrO_2$, $BaZrO_2$, $BaTiO_3$, $Ta_2O_5$, $CaO$, $SrO$, $BaO$, $La_2O_3$, $Ce_2O_3$, $Pr_2O_3$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$ and $Lu_2O_3$ with a thickness between about 40 Å and about 500 Å.

7. The method as defined by claim 2, wherein the step of forming a stacked oxide layer includes forming the block oxide layer comprising a single layer or a multi-layer of a first block oxide layer and a second block oxide layer.

8. The method as defined by claim 7, wherein the step of forming a block oxide layer includes forming a single layer of one of $SiO_2$, $Al_2O_3$ and $Y_2O_3$ with a thickness between about 40 Å and about 200 Å.

9. The method as defined by claim 7, wherein the step of forming a block oxide layer includes forming the first block oxide layer of one of $SiO_2$, $Al_2O_3$ and $Y_2O_3$ with a thickness between about 5 Å and about 50 Å, and forming the second block oxide layer of one of $Al_2O_3$, $Y_2O_3$, $HfO_2$, $ZrO_2$, $BaZrO_2$, $BaTiO_3$, $Ta_2O_5$, CaO, SrO, BaO, $La_2O_3$, $Ce_2O_3$, $Pr_2O_3$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$ and $Lu_2O_3$ with a thickness between about 40 Å and about 200 Å.

10. The method as defined by claim 1, wherein the step of forming a polysilicon layer for a control gate includes forming the polysilicon layer with a thickness between about 500 Å and about 3000 Å.

11. The method as defined by claim 1, wherein the step of forming a buffer oxide 30 layer includes forming the buffer oxide later with a thickness between about 100 Å and about 200 Å and the step of forming a buffer nitride layer includes forming the buffer nitride layer with a thickness between about 100 Å and about 2000 Å.

12. The method as defined by claim 1, wherein the step of forming sidewall spacers on the sidewalls of the control gate and the word line includes simultaneously forming a second device isolation structure in the second device isolation region.

13. The method as defined by claim 1, wherein the step of forming a second device isolation region includes etching the second device isolation structure more deeply than common source and drain regions to prevent a leakage current due to a punch-through between the common source and drain regions.

14. The method as defined by claim 1, wherein the step of depositing polysilicon for a word line includes depositing polysilicon with a thickness between about 500 Å and about 3000 Å.

* * * * *